United States Patent
Naritake (10) Patent No.: US 7,532,059 B2
(45) Date of Patent: May 12, 2009

(54) SEMICONDUCTOR INTEGRATED CIRCUIT DEVICE AND SUBSTRATE BIAS CONTROLLING METHOD

(75) Inventor: Isao Naritake, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 94 days.

(21) Appl. No.: 11/783,432

(22) Filed: Apr. 9, 2007

(65) Prior Publication Data

US 2007/0236277 A1 Oct. 11, 2007

(30) Foreign Application Priority Data

Apr. 10, 2006 (JP) ............................... 2006-107075

(51) Int. Cl.
*G05F 1/10* (2006.01)

(52) U.S. Cl. ...................................... 327/534

(58) Field of Classification Search ................ 327/530, 327/534, 537
See application file for complete search history.

(56) References Cited

U.S. PATENT DOCUMENTS

| | | | | |
|---|---|---|---|---|
| 5,682,118 A | * | 10/1997 | Kaenel et al. | ................ 327/534 |
| 6,147,508 A | * | 11/2000 | Beck et al. | ..................... 326/32 |
| 6,466,077 B1 | * | 10/2002 | Miyazaki et al. | ............. 327/534 |
| 6,653,890 B2 | | 11/2003 | Ono et al. | |

FOREIGN PATENT DOCUMENTS

JP 2003-0142598 A 5/2003

* cited by examiner

*Primary Examiner*—Jeffrey S Zweizig
(74) *Attorney, Agent, or Firm*—Foley & Lardner LLP (57) ABSTRACT

A semiconductor integrated circuit device includes: a first bias generating circuit, a second bias generating circuit and a control circuit. The first bias generating circuit generates a first substrate bias voltage of a P-channel transistor. The second bias generating circuit generates a second substrate bias voltage of N-channel transistor. The control circuit controls the first bias generating circuit and the second bias generating circuit independently on the basis of operating states of circuits to which the first substrate bias voltage and the second substrate bias voltage are applied.

13 Claims, 11 Drawing Sheets

| OUTPUT OF DELAY MONITOR PORTION | OUTPUT OF PN BALANCE MONITOR CIRCUIT | | | NORMAL OUTPUT | LIMIT VALUE OPERATION | |
|---|---|---|---|---|---|---|
| | EN3 | EN1 | EN2 | | LIMIT VALUE | OUTPUT |
| DOWN | H | H | H | NDWN | CNmn | — |
| | L | H | H | NDWN | CNmn | PDWN |
| | L | L | H | PDWN | CPmn | NDWN |
| | L | L | L | PDWN | CPmn | — |
| UP | H | H | H | PUP | CPmx | — |
| | L | H | H | PUP | CPmx | NUP |
| | L | L | H | NUP | CNmx | PUP |
| | L | L | L | NUP | CNmx | — |

| OUTPUT OF DELAY MONITOR PORTION | OUTPUT OF PN BALANCE MONITOR CIRCUIT | | | NORMAL OUTPUT | LIMIT VALUE OPERATION | |
|---|---|---|---|---|---|---|
| | EN3 | EN1 | EN2 | | LIMIT VALUE | OUTPUT |
| DOWN | H | H | H | NDWN | CNmn | — |
| DOWN | L | H | H | NDWN | CNmn | PDWN |
| DOWN | L | L | H | PDWN | CPmn | NDWN |
| DOWN | L | L | L | PDWN | CPmn | — |
| UP | H | H | H | PUP | CPmx | NUP |
| UP | L | H | H | PUP | CPmx | NUP |
| UP | L | L | H | NUP | CNmx | PUP |
| UP | L | L | L | NUP | CNmx | PUP |

SEMICONDUCTOR INTEGRATED CIRCUIT DEVICE AND SUBSTRATE BIAS CONTROLLING METHOD

BACKGROUND OF THE INVENTION

1. Field of the Invention

The present invention relates to a substrate bias controlling method adapted to control a substrate bias of a transistor and a semiconductor integrated circuit device in which a substrate bias is controlled by means of the controlling method.

2. Description of the Related Art

In recent years, the number of terminals powered by batteries such as a cell-phone and a mobile information apparatus is on the increase, and built-in semiconductor integrated circuits with lower power consumption have made progress. So far, power consumption has been reduced by lowering supply voltage. Accordingly, although operating speed is decreased, higher operating speed has been accomplished by increasing an ON-current by lowering a threshold voltage of a transistor. However, a leakage current is increased as the semiconductor is further refined and the operating speed grows higher. Accordingly, a leakage current flows inside the semiconductor integrated circuit irrespective of its operation and makes up a significant portion of the power consumption of the semiconductor integrated circuit. Therefore, in order to reduce the power consumption of the semiconductor integrated circuit, it is effective to restrain the leakage current of the transistor. It is known that there is a relationship between the leakage current of the transistor and the ON-current. That is to say, since the ON-current is proportional to a logarithmic value of leakage current, restraint of the leakage current also concurrently restrains the ON-current.

Figure 1:
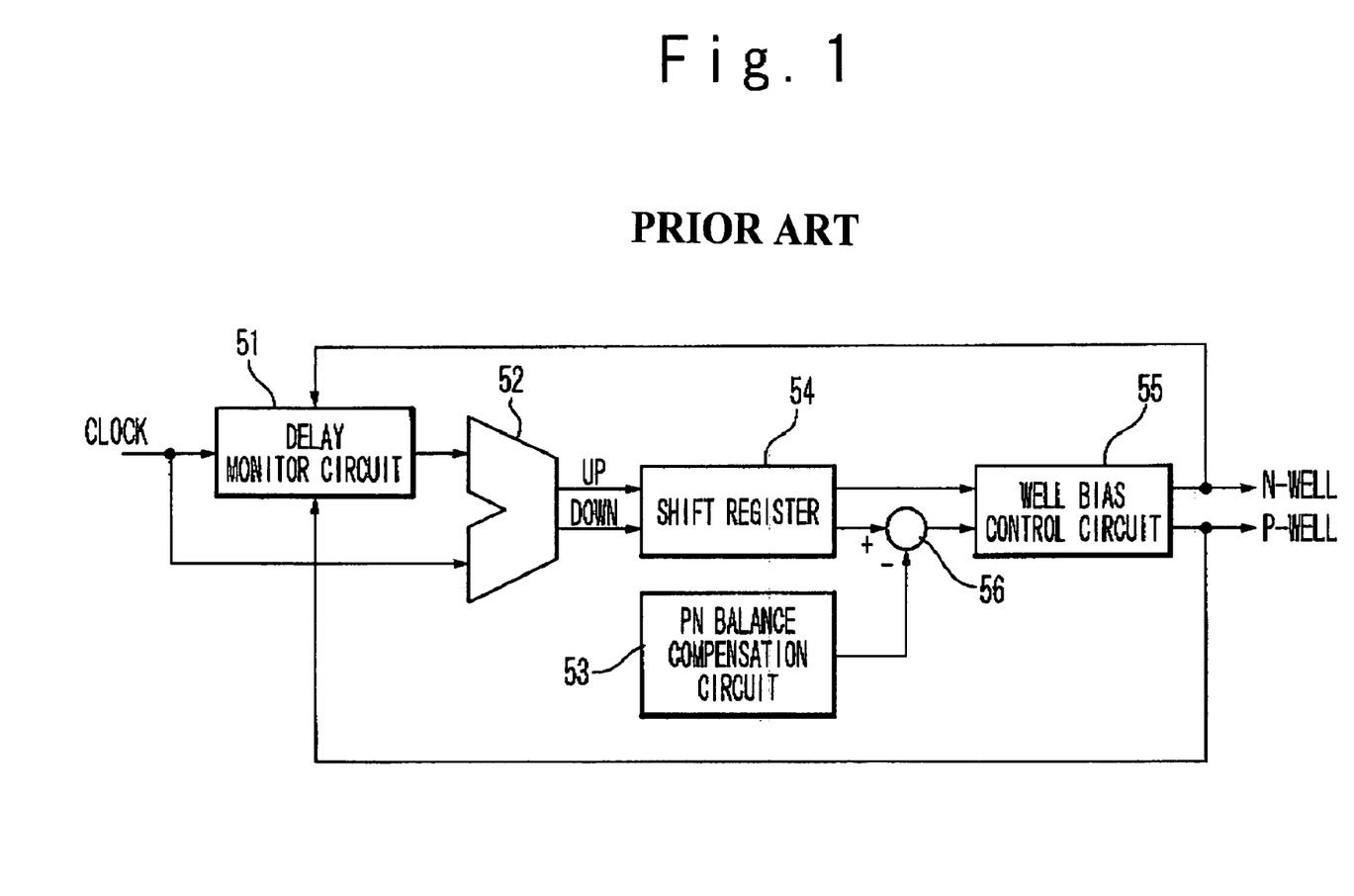
FIG. 1 is a block diagram showing a configuration of a conventional substrate bias control circuit.

For example, Japanese Laid-Open Patent Application JP2003-142598A discloses a technique adapted simultaneously to carry out compensation for change of an operating speed of a circuit due to manufacturing process and temperature change and compensation for a difference in a threshold voltage between a P-channel transistor and an N-channel transistor by controlling a well bias of the transistor. FIG. 1 is a block diagram showing a configuration of this conventional semiconductor integrated circuit. As shown in FIG. 1, this semiconductor integrated circuit includes a delay monitor circuit 51, a comparison circuit 52, a PN balance compensation circuit 53, and a well bias control circuit 55. The delay monitor circuit 51 delays an input clock and outputs the delayed clock. The comparison circuit 52 compares the input clock with the delayed clock. The PN balance compensation circuit 53 detects threshold voltage difference between a P-channel transistor and a N-channel transistor. The well bias control circuit 55 controls a well bias of the transistor by reflecting the output of the PN balance compensation circuit 53 by means of an adder 56 on the output of the comparison circuit 52.

Figure 2:
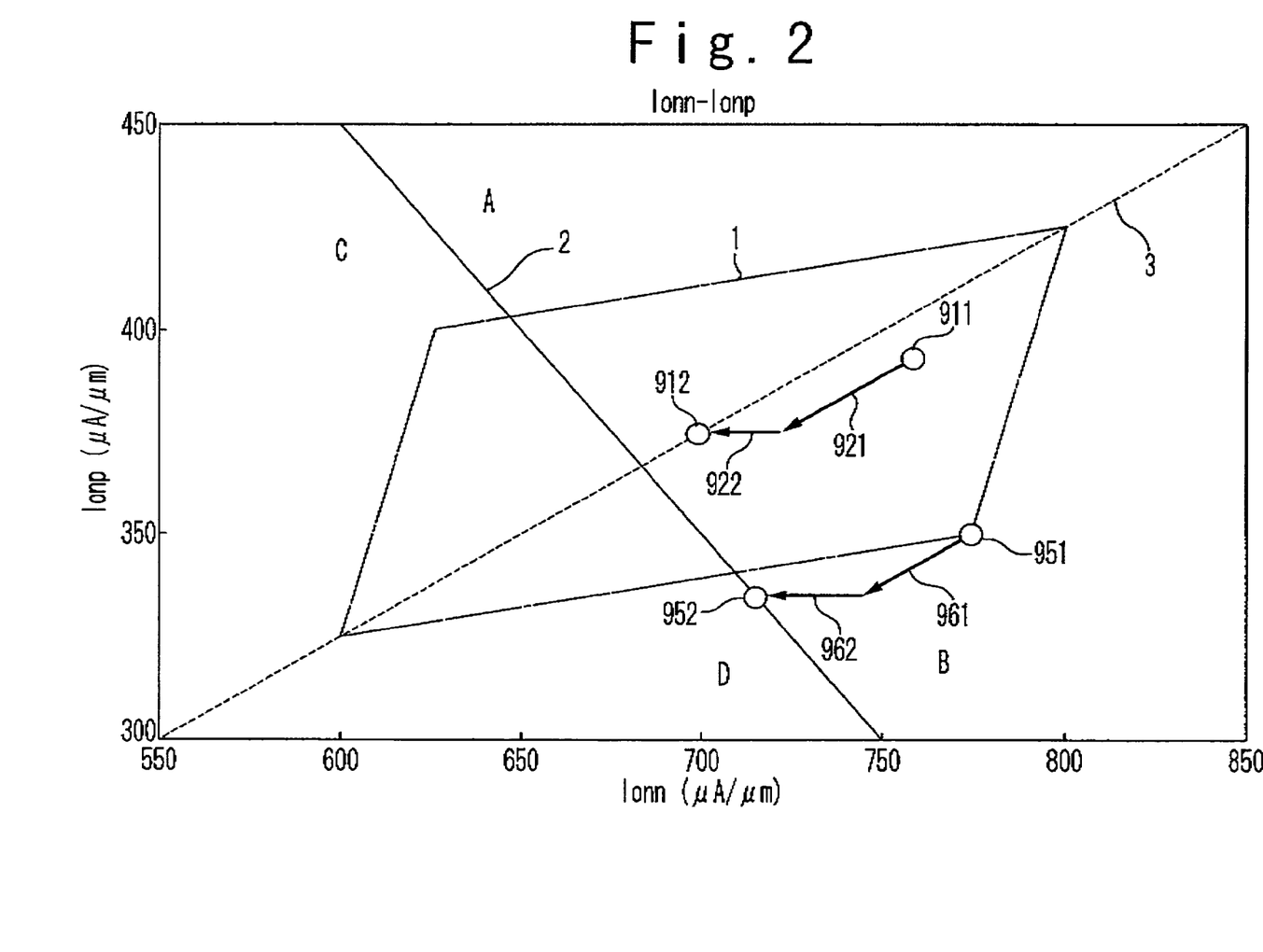
FIG. 2 is a graph for explaining the operation of the conventional substrate bias control circuit.

Next, a bias controlling method of this semiconductor integrated circuit will be described specifically with reference to FIG. 2. FIG. 2 is a graph for explaining the operation of this conventional semiconductor integrated circuit. This drawing mainly shows element characteristics of this semiconductor integrated circuit. The vertical axis shows an ON-current Ionp of the P-channel transistor and the horizontal axis shows an ON-current Ionn of the N-channel transistor. An area enclosed by an alternate long and short dash line 1 indicates an allowable range of the ON-current. An area within the inside of the alternate long and short dash line 1 indicates characteristics of allowable ON-current, that is, allowable leakage current. This area is determined depending on the manufacturing process and the operating requirements such as a supply voltage.

A reference of delay value of the N-channel transistor and the P-channel transistor is indicated by a solid line 2 using an index which is a total value of the ON-current Ionn of the N-channel transistor and the ON-current Ionp of the P-channel transistor. Hereinafter, characteristic indicated by the solid line 2 is referred to as a delay monitor target. A total value of the ON-current Ionn and the ON-current Ionp is preferably close to the delay monitor target 2.

An index showing a balance between the ON-current Ionn and the ON-current Ionp is indicated by a dashed line 3. Hereinafter, the dashed line 3 is referred to as a PN balance monitor target. The ON-current Ionn and the ON-current Ionp are preferably close to the PN balance monitor target 3. Therefore, the ON-current Ionn and the ON-current Ionp are most preferably close to an intersection of the delay monitor target 2 with the PN balance monitor target 3.

A characteristic shown by a point 911 indicates that a sum of the ON-current (Ionn+Ionp) is larger than a sum of the delay monitor target 2 and that the delay value of the N-channel transistor and the P-channel transistor is shorter (operating speed is faster) than the reference value. Moreover, since the point 911 is away from the PN balance monitor target 3, the characteristic shown by the point 911 indicates that the ON-current Ionn and the ON-current Ionp are not balanced. In this case, it is indicated that a threshold voltage of the N-channel transistor is biased to relatively a lower threshold voltage as compared with that of the P-channel transistor.

The characteristic shown by the point 911 turns out to be a characteristic shown by a point 912 when the well bias of the transistor is controlled. In reference to this transition of the characteristics, an adjustment amount varied along the PN balance monitor target 3 as indicated by an arrow 921 corresponds to an amount adjustment of a voltage of the well bias of both the N-channel transistor and the P-channel transistor. Moreover, an adjustment amount varied only in the ON-current Ionn as indicated by an arrow 922 is adjusted because the threshold voltage on the N-channel side is biased to a lower voltage. This corresponds to an adjustment amount due to a voltage rise of the well bias of the N-channel transistor. By means of this adjustment, it is found that the ON-currents of the N-channel transistor and the P-channel transistor come closer to the intersection of the delay monitor target 2 with the PN balance monitor target 3 so that more appropriate well bias will be given.

However, a characteristic shown by a point 951 is similarly adjusted to a characteristic shown by a point 952 by means of adjustment amounts as indicated by arrows 961 and 962. In this case, the characteristic shown by the point 952 is out of the allowable range of the ON-current. This is because the point 952 is out of the allowable range 1 of the ON-current although the point 952 reaches the delay monitor target 2.

As described above, according to the above-mentioned technique, there is a possibility that the ON-currents of the N-channel transistor and the P-channel transistor deviate from the allowable range of the ON-current (leakage current) when a substrate bias is controlled. The manufacturing requirements are set so that the ON-current and the leakage current allowable for the transistor are within a specific range. Application of the substrate bias which yields an ON-current and a leakage current deviating from this allowable range may have an effect on the failure rate of the transistor, and so forth.

Besides, in the above-mentioned document, the balance between the ON-current of the P-channel transistor and the ON-current of the N-channel transistor (corresponding to "balance of leakage currents", hereinafter referred to as "PN balance") is monitored by comparing the logical threshold voltage, which is produced by short-circuiting an input and an output of an inverter, with the reference voltage. This method of producing the logical threshold voltage causes increase of power consumption because an electric current passes through the transistors.

In this manner, the substrate bias voltage control circuit is required to control the substrate bias voltage and reduce the leakage current such that the ON-current does not deviate from the allowable range of the ON-current.

It is desired to provide a semiconductor integrated circuit device having a substrate bias voltage control circuit and executing a substrate bias voltage control method, in which an ON-current is hard to deviate from transistor's performance management range and which can supply an appropriate substrate bias voltage.

SUMMARY OF THE INVENTION

In order to achieve an aspect of the present invention, the present invention provides a semiconductor integrated circuit device including: a first bias generating circuit configured to generate a first substrate bias voltage of a P-channel transistor; a second bias generating circuit configured to generate a second substrate bias voltage of N-channel transistor; and a control circuit configured to control the first bias generating circuit and the second bias generating circuit independently on the basis of operating states of circuits to which the first substrate bias voltage and the second substrate bias voltage are applied.

In the present invention, the control circuit controls the first bias generating circuit and the second bias generating circuit independently on the basis of operating states of circuits to which the first substrate bias voltage and the second substrate bias voltage are applied. That is, the first substrate bias voltage and second substrate bias voltage can be adjusted independently to the appropriate values based on the operating situation. Therefore, the ON-current does not deviate from the transistor's performance management range and which can supply an appropriate substrate bias voltage. Furthermore, according to the present invention, since the appropriate substrate bias voltage is supplied to the semiconductor integrated circuit device, it is possible to reduce a useless leakage current. Moreover, according to the present invention, since the allowable range of the PN balance is set and the substrate bias voltage is controlled so that the leakage current is minimized within the allowable range of the PN balance, it is possible to further reduce the leakage current.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a substrate bias controlling method and a semiconductor integrated circuit device according to the present invention will be described below with reference to the attached drawings.

Figure 3:
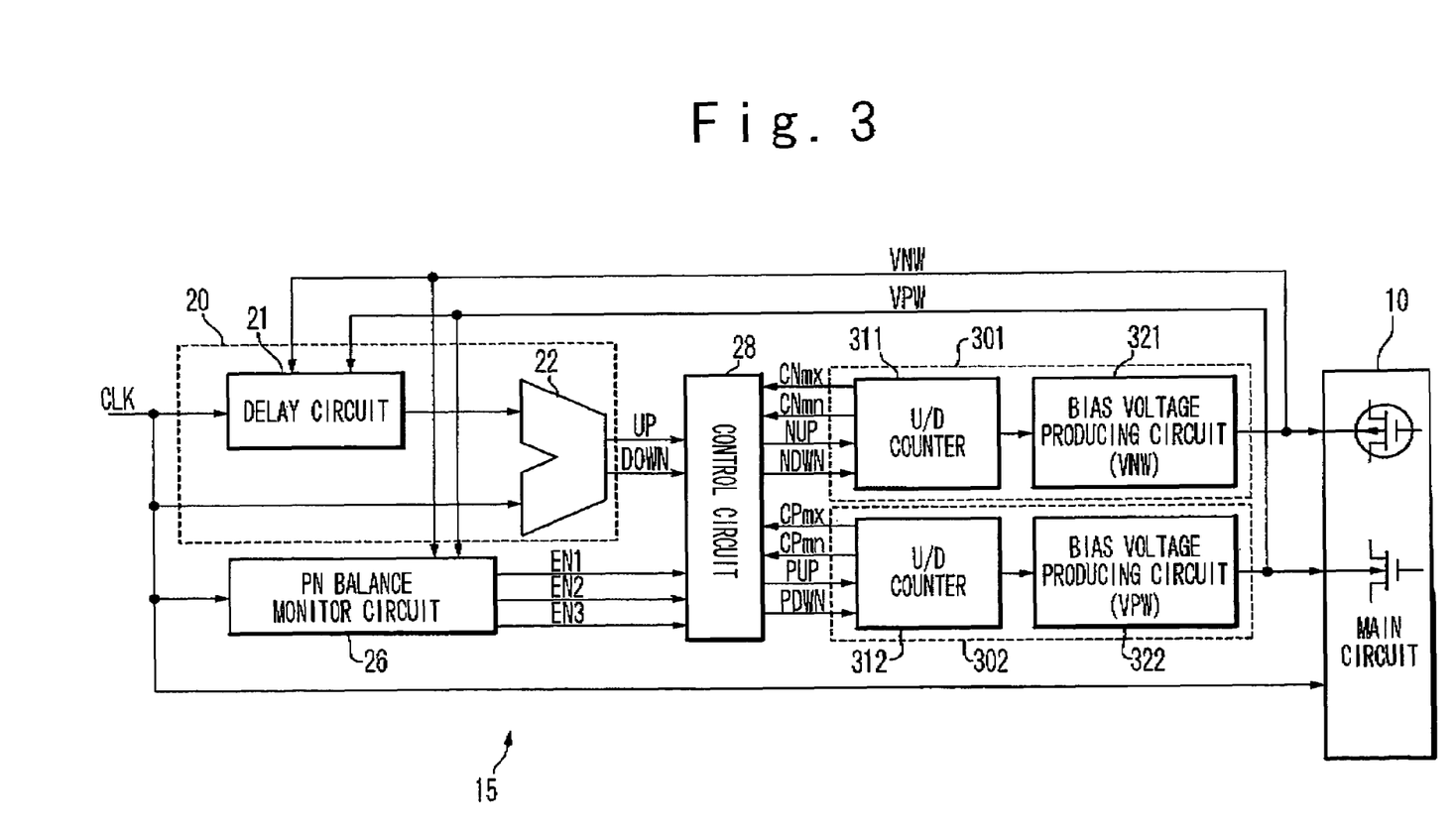
FIG. 3 is a block diagram showing a configuration of semiconductor integrated circuit device and substrate bias control circuit of an embodiment according to the present invention.

FIG. 3 is a block diagram showing a configuration of the semiconductor integrated circuit device and the substrate bias control circuit according to the embodiments of the present invention. The semiconductor integrated circuit device includes a main circuit 10 and a substrate bias control circuit 15. The main circuit 10 is a subject whose substrate bias is controlled by the substrate bias control circuit 15. The substrate bias control circuit 15 controls the substrate bias of the main circuit 10. The substrate bias control circuit 15 includes a delay monitor portion 20, a PN balance monitor circuit 26, a control circuit 28, and voltage producing portions 301, 302. The voltage producing portion 301 includes an Up/Down counter (U/D counter) 311 and a bias voltage producing circuit 321. The voltage producing portion 302 includes an Up/Down counter (U/D counter) 312 and a bias voltage producing circuit 322.

The display monitor portion 20 includes a delay circuit 21 and a comparator 22, which compares whether signal propagation delay time coincides with a design value and outputs the result of comparison to the control circuit 28. That is to say, the delay circuit 21 delays an inputted clock signal CLK and outputs the delayed clock signal to the comparator 22. The comparator 22 compares a phase of the clock signal delayed by the delay circuit 21 with a phase of the inputted clock signal CLK. When it is indicated that the phase difference is faster than the designed delay time, the comparator 22 makes a signal UP active. Besides, when it is indicated that the phase difference is later than the designed delay time, the comparator 22 makes a signal DOWN active. Therefore, if the phase difference is equal to the designed value, either signal will not be made active. A substrate bias VNW of the P-channel transistor and a substrate bias VPW of the N-channel transistor controlled by the substrate bias control circuit 15 are supplied to the delay circuit 21. That is, the N-channel transistors and the P-channel transistors of the delay circuit 21 are driven in these substrate bias VPW, VNW, respectively. In this manner, a feedback loop for the delay time is formed.

Figure 4:
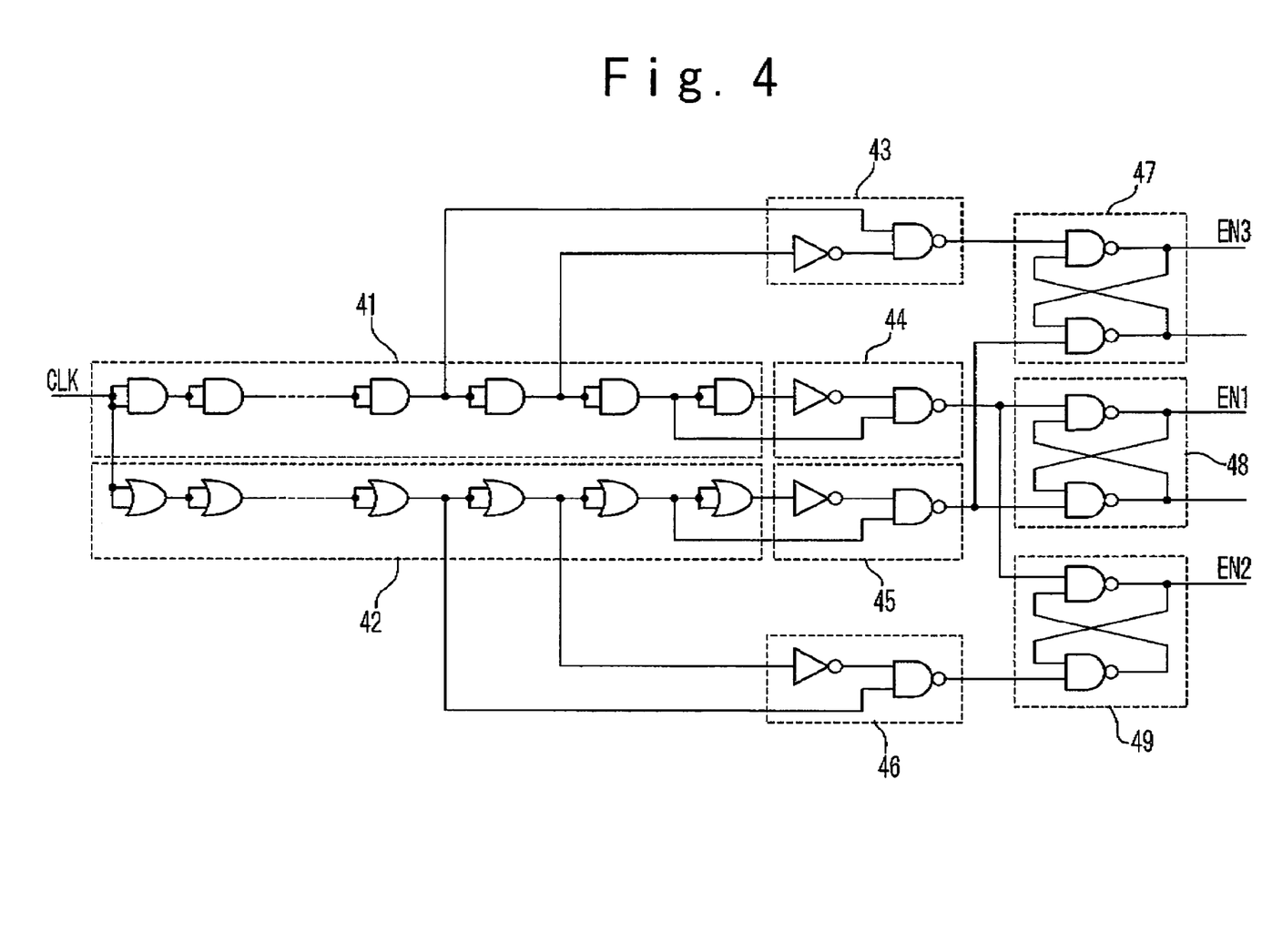
FIG. 4 is a circuit diagram showing an example of a configuration of a PN balance monitor circuit of the embodiment according to the present invention.

The PN balance monitor circuit 26 judges a PN balance on the basis of a difference in delay time between the P-channel elements and the N-channel elements and outputs the result of judgment to the control circuit 28. FIG. 4 is a circuit diagram showing an example of a configuration of the PN balance monitor circuit 26. As shown in FIG. 4, the PN balance monitor circuit 26 includes delay circuits 41, 42, rising detection circuits 43, 44, 45, 46, and RS flip-flops 47, 48, 49. Here, the delay circuit 41 provides a delay by means of a cascaded group of AND circuits, and the delay circuit 42 provides a delay by means of a cascaded group of OR circuits.

Figure 5A:
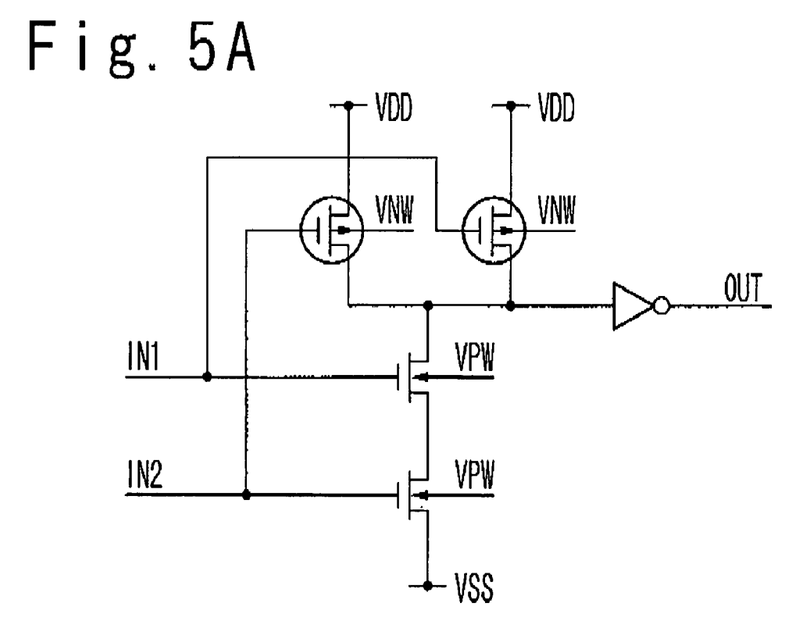
FIG. 5A is a circuit diagram showing an example of a configuration of an AND circuit of the embodiment according to the present invention.

FIG. 5A is a circuit diagram showing an example of a configuration of the AND circuit. As shown in FIG. 5A, the AND circuit includes parallel-connected P-channel transistors and serial-connected N-channel transistors, and its delay time depends on the N-channel transistors.

Figure 5B:
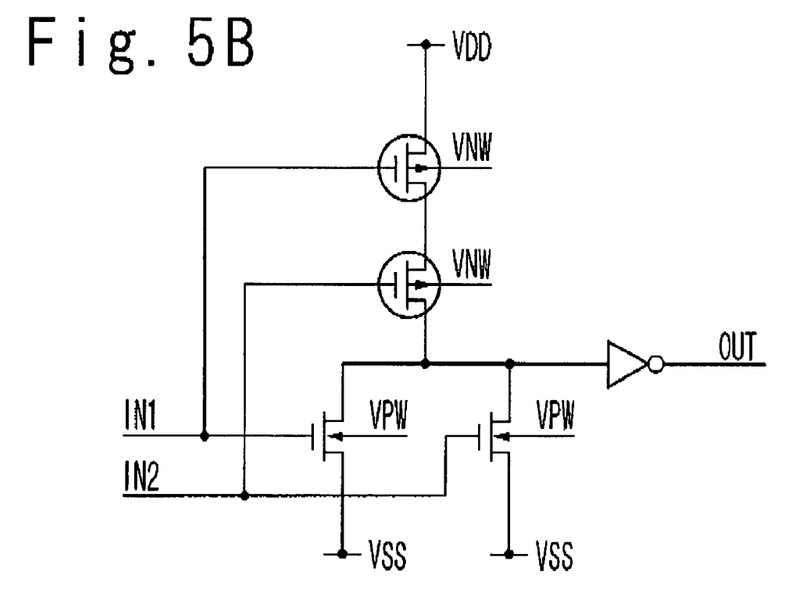
FIG. 5B is a circuit diagram showing an example of a configuration of an OR circuit of the embodiment according to the present invention.

FIG. 5B is a circuit diagram showing an example of a configuration of the OR circuit. As shown in FIG. 5B, the OR circuit includes serial-connected P-channel transistors and parallel-connected N-channel transistors, and its delay time depends on the P-channel transistors. Since the AND circuits and the OR circuits are multistage-connected, delay time is amplified and manufacturing dispersion among elements is averaged. The delay circuit 41 and the delay circuit 42 are configured such that a delay value of the delay circuit 41 is equal to a delay value of the delay circuit 42 when the PN balance is achieved. The substrate bias VNW of the P-channel transistor and the substrate bias VPW of the N-channel transistor controlled by the substrate bias control circuit 15 are supplied to the delay circuits 41, 42. That is, the N-channel transistors and the P-channel transistors of the delay circuits 41, 42 are driven in these substrate bias VPW, VNW, respectively. In this manner, a feedback loop for the PN balance is formed.

Here, the AND circuits and the OR circuits may be replaced by the NAND circuits and NOR circuits, respectively.

As shown in FIG. 4, delayed clock signals are supplied from predetermined nodes of the delay circuits 41, 42 to the rising detection circuits 43 to 46, respectively. At this time, the clock signal with the delay time shorter by the duration of two circuits than the clock signal supplied to the rising detection circuit 44 is supplied to the rising detection circuit 43. Similarly, the clock signal with the delay time shorter by the duration of two circuits than the signal supplied to the rising detection circuit 45 is supplied to the rising detection circuit 46. This delay time for the duration of two circuits corresponds to the allowable range of the PN balance. Therefore, it is possible to change the allowable range of the PN balance by changing the position where the delayed signals are taken out from the delay circuits 41, 42.

The rising detection circuits 43 to 46 produce signals indicating the rising position of the inputted signals and outputs to the RS flip flops 47 to 49, respectively. The RS flip flop 47 sets an output signal EN3 of "H" from a time when the detection circuit 43 detects the rising position until the rising detection circuit 45 detects the rising position, and an output signal EN3 of "L" from a time when the detection circuit 45 detects the rising position until the rising detection circuit 43 detects the rising position. The RS flip flop 48 sets an output signal EN1 of "H" from a time when the detection circuit 44 detects the rising position until the rising detection circuit 45 detects the rising position, and an output signal EN1 of "L" from a time when the detection circuit 45 detects the rising position until the rising detection circuit 44 detects the rising position. The RS flip flop 49 sets an output signal EN2 of "H" from a time when the detection circuit 44 detects the rising position until the rising detection circuit 46 detects the rising position, and an output signal EN2 of "L" from a time when the detection circuit 46 detects the rising position until the rising detection circuit 44 detects the rising position.

The output signals EN1, EN2, EN3 exchange "H" or "L" with "L" or "H", respectively, at the rising position of the delayed clock signal. Therefore, at the time when the clock signal rises, the output signals EN1, EN2, EN3 indicate which signal rises later out of two signals inputted into the RS flip flops 47, 48, 49 to be compared. That is to say, the output signals EN1 to EN3 have the following meaning. The output signal EN1 is the result of comparison of the delay values between the delay circuit 41 (AND circuit pass) and the delay circuit 42 (OR circuit pass), wherein these delay values should be equal if manufacturing dispersion is balanced. Therefore, "L" of the signal EN1 indicates that the delay value on the AND circuit side is small. More specifically, in this case, it signifies that the threshold voltage of the N-channel transistor is biased toward lower voltage in comparison with the threshold voltage of the P-channel transistor. If the signal EN1 is "H", it signifies reversely that a threshold voltage of the P-channel transistor is biased toward a lower voltage in comparison with the threshold voltage of the N-channel transistor.

The output signal EN2 is the result of comparison of the delay values in a pass where a delay value of the delay circuit 41 (AND circuit pass) is smaller than a delay value of the delay circuit 42 (OR circuit pass), if the manufacturing dispersion is balanced. That is to say, this is a comparison when a predetermined margin is given to the delay circuit 42 side. Therefore, when the signal EN2 is "L", the delay value of the AND circuit pass is smaller by the duration of two circuits or more. More specifically, it signifies that the threshold voltage of the N-channel transistor is biased toward lower voltage in comparison with the threshold voltage of the P-channel transistor. If the signal EN2 is "H", it signifies one of two cases. One case is that the threshold voltage of the P-channel transistor is smaller than the threshold voltage of the N-channel transistor. The other case is that the threshold voltage of the N-channel transistor is lower than the threshold voltage of the P-channel transistor by the margin.

The output signal EN3 is the result of comparison of the delay values in a pass where a delay value of the delay circuit 41 (AND circuit pass) is larger than a delay value of the delay circuit 42 (OR circuit pass), if the manufacturing dispersion is balanced. That is to say, this is a comparison when a predetermined margin is given to the delay circuit 41. Therefore, when the signal EN3 is "H", the delay value of the OR circuit pass is smaller by the duration of two circuits or more. More specifically, it signifies that the threshold voltage of the P-channel transistor is biased toward lower voltage in comparison with the threshold voltage of the N-channel transistor. If the signal EN3 is "L", it signifies one of two cases. One case is that the threshold voltage of the N-channel transistor is smaller than the threshold voltage of the P-channel transistor. The other case is that the threshold voltage of the P-channel transistor is lower than the threshold voltage of the N-channel transistor by the margin. The signals EN1 to EN3 produced in this manner are outputted to the control circuit 28.

The control circuit 28 receives the judgment result signal UP or DOWN with respect to the delay monitor target 2 and the judgment result signals EN1, EN2, EN3 with respect to the PN balance monitor target 3. Besides, the control circuit 28 receives signals CNmx, CNmn from the voltage producing portion 301 to notify that the substrate bias voltage VNW of the P-channel transistor reaches upper or lower limit, and signals CPmx, CPmn from the voltage producing portion 302 to notify that the substrate bias voltage VPW of the N-channel transistor reaches upper or lower limit. On the basis of these input signals, the control circuit 28 instructs to raise or lower the substrate bias voltage to the voltage producing portions 301, 302 every time the clock signal CLK rises.

Figure 6:
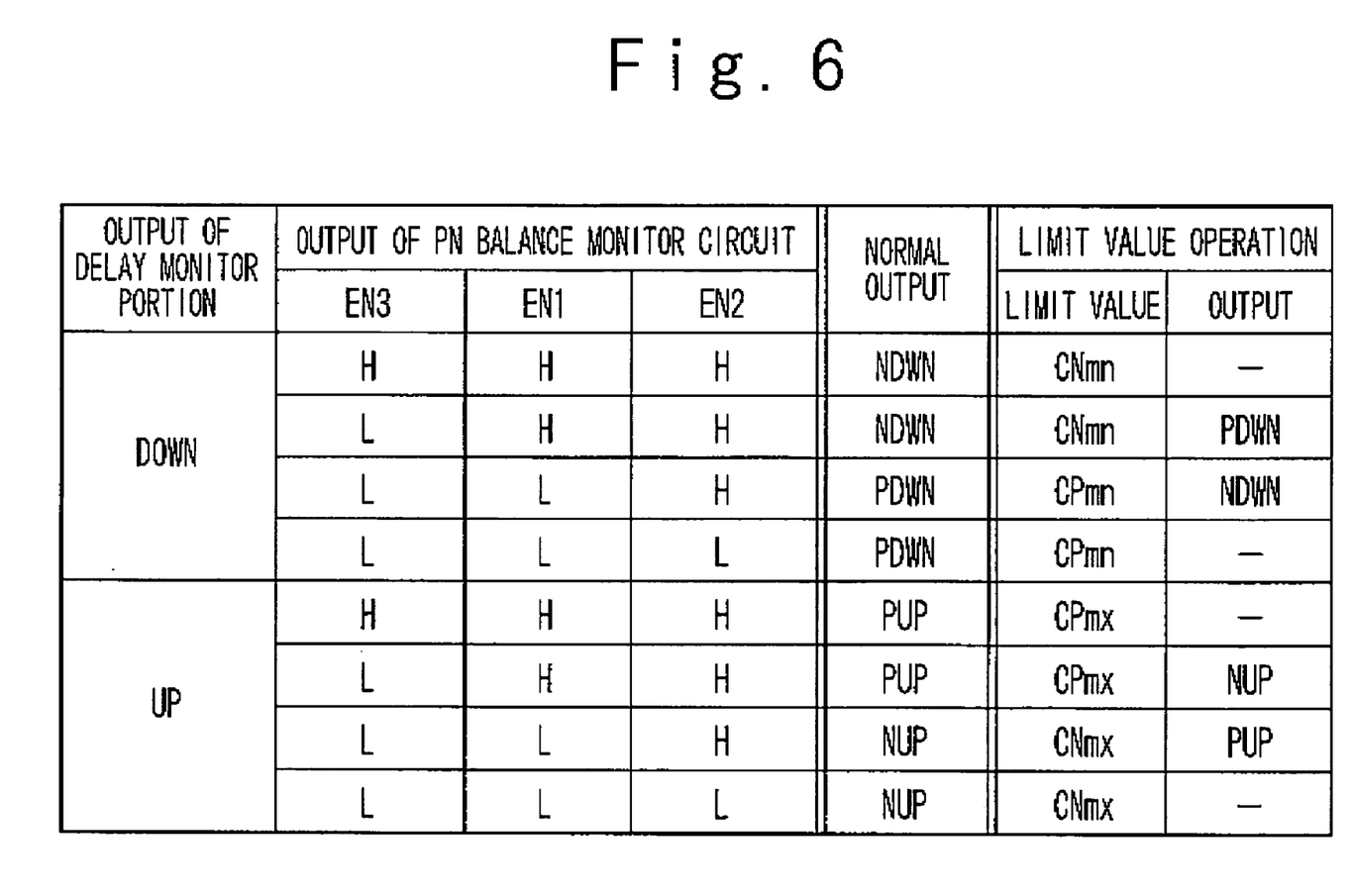
FIG. 6 is a truth table showing an example of the control logic of a control circuit of the embodiment according to the present invention.

Control logic of the control circuit 28 can be represented by a truth table. FIG. 6 is the truth table showing an example of the control logic of the control circuit 28. As shown in FIG. 6, when the output signal DOWN of the delay monitor portion 20 is active, the basic control logic is as follows. The control circuit 28 makes the signal NDWN active when the output signal (EN1, EN2) of the PN balance monitor circuit 26 is (H, H), and the control circuit 28 makes the signal PDWN active when the output signal (EN1, EN3) is (L, L). When the output signal UP of the delay monitor portion 20 is active, the basic control logic is as follows. The control circuit 28 makes the signal PUP active when the output signal (EN1, EN2) is (H, H), and the control circuit 28 makes the signal NUP active when the output signal (EN1, EN3) is (L, L) The signal NDWN instructs the voltage producing portion 301 to apply the further deep bias, and the signal NUP instructs the voltage producing portion 301 to apply the further shallow bias. The signal PDWN instructs the voltage producing portion 302 to apply the further deep bias, and the signal PUP instructs the voltage producing portion 302 to apply the further shallow bias.

Here, increasing the substrate bias in the reverse-bias direction of the MOS transistor is described as "apply the further deep substrate bias", and increasing the substrate bias in the forward-bias direction is described as "apply the further shallow substrate bias". Applying the further deep bias gets lower the operating speed of the element, and applying the further shallow bias gets faster the operating speed of the element. Besides, a reverse-bias signifies a bias in the direction that an electric current is hard to flow. Therefore, a relatively high voltage is applied to the substrate for the P-channel transistor, and a low relatively voltage is applied to the substrate for the N-channel transistor. Thus, a voltage applied to the P-channel is reverse to a voltage applied to the N-channel.

The control circuit operates in synchronization with a clock signal, and may control one of the substrate bias (voltage) of the N-channel transistor and the substrate bias (voltage) of the P-channel transistor in one period of the clock signal. For example, one row (line) in the truth table of FIG. 6 may correspond to an operation in one period of the clock signal.

Moreover, when the voltage producing portions 301, 302 reach limit values, the control logic varies in the following manner. When the signal CNmn indicating that the voltage producing portion 301 reaches the limit value is made active and the signal EN3 is "L", the control circuit 28 makes the signal PDWN active which is outputted to the voltage producing portion 302 since the voltage producing portion 301 cannot apply the further deep bias. Besides, when the signal CPmn indicating that the voltage producing portion 302 reaches the limit value is made active and the signal EN2 is "H", the control circuit 28 makes the signal NDWN active which is outputted to the voltage producing portion 301 since the voltage producing portion 302 cannot apply the further deep.

Figure 7:
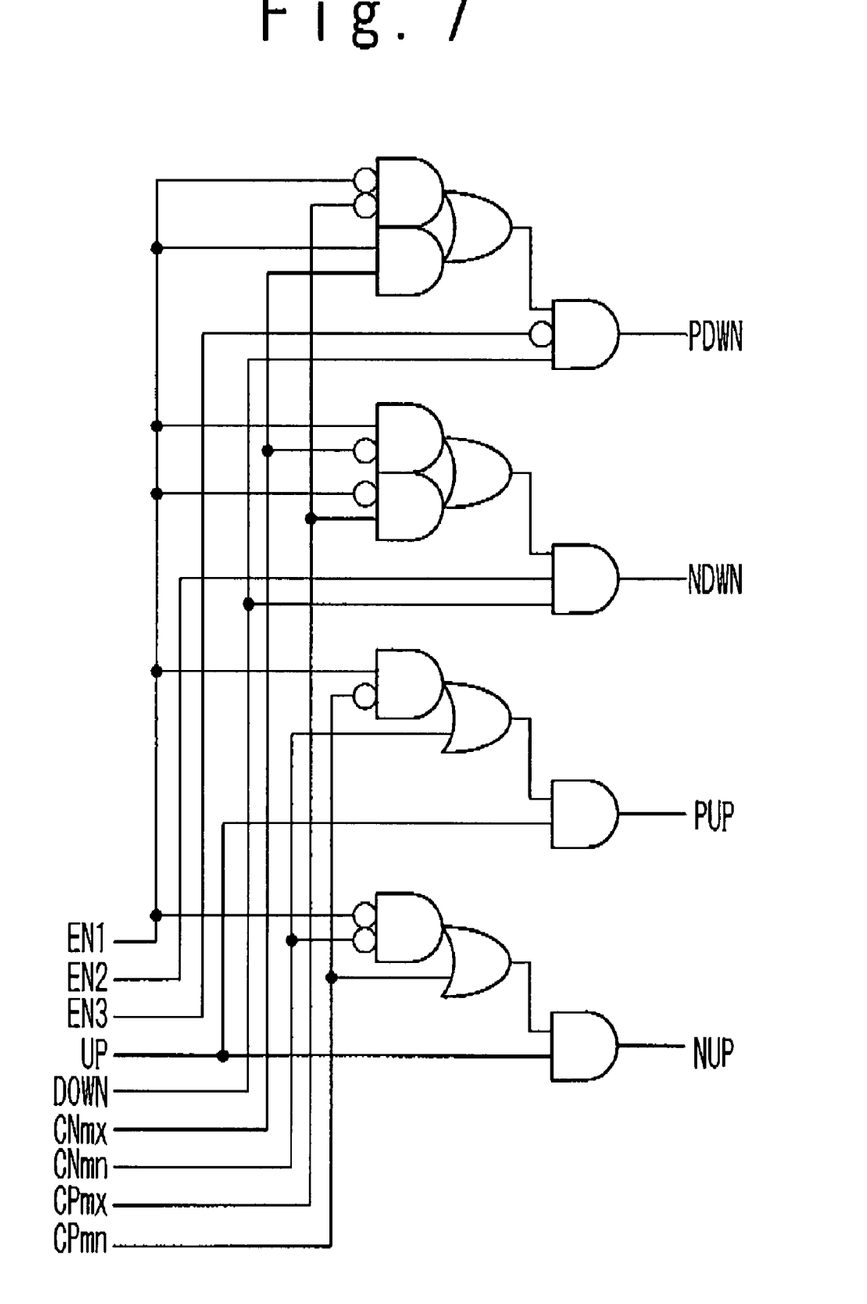
FIG. 7 is a circuit diagram showing an example of a configuration of a control circuit of the embodiment according to present invention.

When the signal CPmx indicating that the voltage producing portion 302 reaches the limit value is made active and the signal EN3 is "L", the control circuit 28 makes the signal NUP active which is outputted to the voltage producing portion 301 since the voltage producing portion 302 cannot apply further shallow bias. Besides, when the signal CNmx indicating that the voltage producing portion 301 reaches the limit value is made active and the signal EN2 is "H", the control circuit 28 makes the signal PUP active which is outputted to the voltage producing portion 302 since the voltage producing portion 301 cannot apply further shallow bias. The above-described logic of this truth table can be put into practice in a combination logic circuit. FIG. 7 is a circuit diagram showing an example of a configuration of the control circuit 28. The combination logic circuit shown in FIG. 7 actualizes the truth table shown in FIG. 6

The voltage producing portion 301 includes the UpDown counter (U/D counter) 311 and the bias voltage producing circuit 321. According to the instructions of the control circuit 28, the U/D counter 311 counts up when the signal NUP is active and counts down when the signal NDWN is active. When the count of the U/D counter 311 reaches the upper limit, the U/D counter 311 makes the signal CNmx active. When the count of the U/D counter 311 reaches the lower limit, the U/D counter 311 makes the signal CNmn active. Then, the U/D counter 311 outputs the signals CNmx, CNmn to the control circuit 28. The bias voltage producing circuit 321 produces the substrate bias voltage VNW of the P-channel transistor on the basis of the count value outputted by the U/D counter 311 and supplies the substrate bias voltage VNW to each portion. Therefore, the voltage producing portion 301 produces the voltage such that the substrate bias of the P-channel transistor is the shallowest when the U/D counter 311 indicates the upper limit, and produces the voltage such that the substrate bias of the P-channel transistor is the deepest when the U/D counter 311 indicates the lower limit.

The voltage producing portion 302 includes the U/D counter 312 and a bias voltage producing circuit 322. According to the instructions of the control circuit 28, the U/D counter 312 counts up when the signal PUP is active and counts down when the signal PDWN is active. When the count of the U/D counter 312 reaches the upper limit, the U/D counter 312 makes the signal CPmx active. When the count of the U/D counter 312 reaches the lower limit, the U/D counter 312 makes the signal CPmn active. Then, the U/D counter 312 supplies the signals CPmx, CPmn to the control circuit 28. The bias voltage producing circuit 322 produces the substrate bias voltage VPW of the N-channel transistor on the basis of the count value outputted by the U/D counter 312 and supplies the substrate bias voltage VPW to each portion. Therefore, the voltage producing portion 302 produces the voltage such that the substrate bias of the N-channel transistor is the shallowest when the U/D counter 312 indicates the upper limit, and produces the voltage such that the substrate bias of the N-channel transistor is the deepest when the U/D counter 312 indicates the lower limit.

Figure 8:
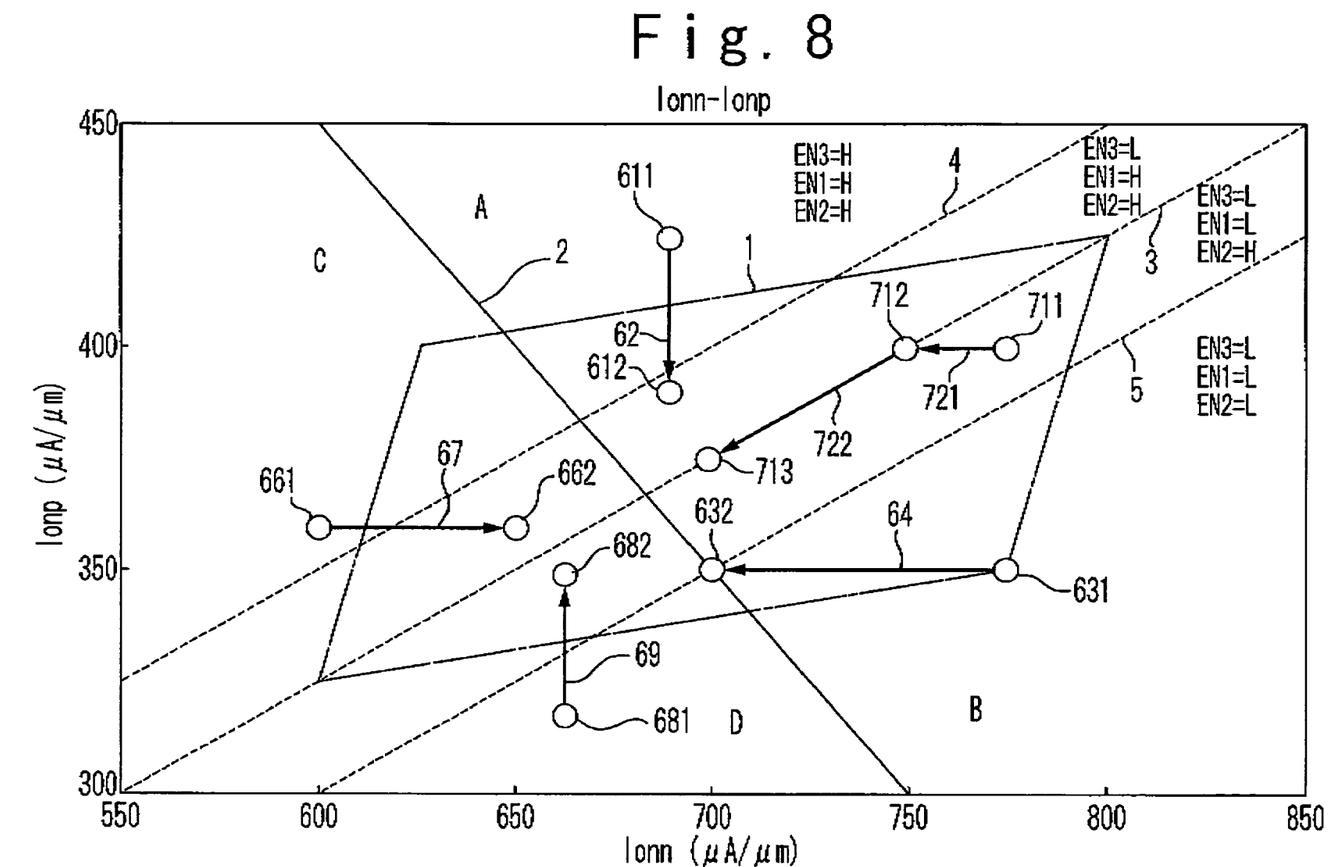
FIG. 8 is a graph for explaining the operation of the substrate bias control circuit of the embodiment according to present invention.

Next, referring to drawings, the operation of the substrate bias control circuit 15 will be described. FIG. 8 is a graph for explaining the operation of the substrate bias control circuit when the voltage producing portions 301, 302 reach the limit values. The vertical axis indicates the ON-current Ionp of the P-channel transistor and the horizontal axis indicates the ON-current Ionn of the N-channel transistor. FIG. 8 shows the element characteristics of the semiconductor integrated circuit. An area enclosed by an alternate long and short dash line 1 indicates the allowable range of the ON-current. The area within the inside of the alternate long and short dash line 1 indicates the characteristics of the allowable ON-current, that is, allowable leakage current. This area is determined depending on the manufacturing process, the operating requirements such as the supply voltage.

A solid line 2 indicates a delay monitor target which is a reference of the delay value of the N-channel transistor and the P-channel transistor. The delay monitor target is indicated by an index which is a total value of the ON-current Ionn and the ON-current Ionp. The total value of the ON-current Ionn and the ON-current Ionp is preferably close to the delay monitor target 2. With this delay monitor target 2 as a boundary, the signal DOWN becomes active in an area where the ON-current Ionp, Ionn is large (area A, B), and the signal UP becomes active in an area where the ON-current is small (area C, D).

A dashed line 3 indicates a PN balance monitor target showing a balance between the ON-current Ionn and the ON-current Ionp. The ON-current Ionn and the ON-current Xonp are preferably close to the PN balance monitor target 3. Therefore, the ON-current Ionn and the ON-current Ionp are most preferably close to the intersection of the delay monitor target 2 with the PN balance monitor target 3. With this delay monitor target 3 as a boundary, the signal EN1 becomes "H" in an area where the ON-current Ionp is large (area A, C enclosed by the delay monitor target 3 and the vertical axis), the signal EN1 becomes "L" in an area where the ON-current Ionn is large (area B, D enclosed by the delay monitor target 3 and the horizontal axis).

Moreover, a dashed line 4 indicates an upper limit of the PN balance monitor target. With this dashed line 4 as a boundary, the signal EN3 becomes "H" in an area where the ON-current Ionp is large (area enclosed by the dashed line 4 and the vertical axis), the signal EN3 becomes "L" in an area where the ON-current Ionn is large (area enclosed by the dashed line 4 and the horizontal axis). A dashed line 5 indicates a lower limit of the PN balance monitor target. With this dashed line 5 as a boundary, the signal EN2 becomes "H" in an area where the ON-current Ionp is large (area enclosed by the dashed line 5 and the vertical axis), the signal EN2 becomes "L" in an area where the ON-current Ionn is large (area enclosed by the dashed line 5 and the horizontal axis).

Therefore, the area of the ON-currents Ionn, Ionp is divided into four areas with the PN balance monitor target 3, dashed lines 4, 5 as boundaries, and then, the characteristics of the elements are described below for each of four areas.

(1) In the case of (EN1, EN2)=(L, L):

The characteristic of the element is plotted in an area further below the dashed line 5 which is located below the PN balance monitor target 3 by a margin. In this area, delay is smaller on the N-channel transistor side even when the P-channel transistor side is provided with a margin. That is to say, the threshold voltage of the N-channel transistor is biased toward further lower voltage than the amount of a margin.

In the case of (EN1, EN2)=(L, H):

The characteristic of the element is plotted in an area between the PN balance monitor target 3 and the dashed line 5 which is located below the PN balance monitor target 3 by the margin. In this area, the threshold voltage of the N-channel transistor is biased toward lower voltage within the margin as compared with the threshold voltage of the P-channel transistor.

In the case of (EN1, EN3)=(H, H):

The characteristic of the element is plotted in an area further above the dashed line 4 which is located above the PN balance monitor target 3 by the margin. In this area, delay is smaller on the P-channel transistor side even when the N-channel transistor side is provided with the margin. That is to say, the threshold voltage of the P-channel transistor is biased toward further lower voltage than the amount of the margin.

In the case of (EN1, EN3)=(H, L):

The characteristic of the element is plotted in an area between the PU balance monitor target 3 and the dashed line 4 which is located above the PN balance monitor target 3 by the margin. In this area, the threshold voltage of the P-channel transistor is biased toward lower voltage within the margin as compared with the threshold voltage of the N-channel transistor.

There are four kinds of signals for controlling the bias voltage produced by the control circuit 28. The signal PDWN leads to the further deep substrate bias of the N-channel transistor, and the signal PUP leads to the further shallow substrate bias of the N-channel transistor. The signal NDWN leads to the further deep substrate bias of the P-channel transistor, and the signal NUP leads to the further shallow substrate bias of the P-channel transistor. The control circuit 28 adjusts the substrate bias by using these signals based on the situation. The substrate bias control circuit 15 operates in the following manner in correspondence with the areas divided by the delay monitor target 2 and the PN balance monitor target 3.

In the area A, the signal DOWN is active, and (EN1, EN2, EN3) become (H, H, H) or (H, H, L). Therefore, referring to FIG. 6, the control circuit 28 makes the signal NDWN active which is outputted to the voltage producing portion 301. The U/D counter 311 counts down. Accordingly, the bias voltage producing circuit 321 increases the substrate bias voltage VNW of the P-channel transistor. When the substrate bias of the P-channel transistor becomes deep, the threshold voltage is increased and the ON-current is decreased, and the operating speed is restrained. That is to say, when the characteristic is plotted in the area A, the substrate bias control circuit 15 adjusts the substrate bias on the P-channel transistor side, and the substrate bias of the P-channel transistor becomes deep. Namely, the characteristic of the element is adjusted in the direction of an arrow 62 shown in FIG. 8. Therefore, as shown in FIG. 8, the characteristic indicated by a point 611 is adjusted to the characteristic indicated by a point 612 when the ON-current Ionp is decreased by an amount of current indicated by the arrow 62. This signifies that the substrate bias of the P-channel transistor becomes deep and the operating speed is decreased, thus it is adjusted to appropriate ON-current Ionp.

In the area B, the signal DOWN is active, and (EN1, EN2, EN3) become (L, L, L) or (L, H, L). Therefore, referring to FIG. 6, the control circuit 28 makes the signal PDWN active which is outputted to the voltage producing portion 302. The U/D counter 312 counts down. Accordingly, the bias voltage producing circuit 322 decreases the substrate bias voltage VPW of the N-channel transistor. When the substrate bias of the N-channel transistor becomes deep, the threshold voltage is increased and the ON-current is decreased, and the operating speed is restrained. That is to say, when the characteristic is plotted in the area B, the substrate bias control circuit 15 adjusts the substrate bias on the N-channel transistor side, and the substrate bias of the N-channel transistor becomes deep. Namely, the characteristic of the element is adjusted in the direction of an arrow 64 shown in FIG. 8. Therefore, as shown in FIG. 8, the characteristic indicated by a point 631 is adjusted to the characteristic indicated by the point 632 when the ON-current Ionn is decreased by an amount of current indicated by the arrow 64. This signifies that the substrate bias of the N-channel transistor becomes deep and the operating speed is decreased, thus it is adjusted to appropriate ON-current Ionn. Besides, although the characteristic indicated by this point 631 is plotted at the same position as that of the characteristic indicated by the point 951 in FIG. 2, since the position after adjustment is plotted at the point 632 in the present embodiment, it is found that the position is adjusted to the point inside of the allowable range 1.

In the area C, the signal UP is active, and (EN1, EN2, EN3) become (H, H, H) or (H, H, L). Therefore, referring to FIG. 6, the control circuit 28 makes the signal PUP active which is outputted to the voltage producing portion 302. The U/D counter 312 counts up. Accordingly, the bias voltage producing circuit 322 increases the substrate bias voltage VPW of the N-channel transistor. When the substrate bias of the N-channel transistor becomes shallow, the threshold voltage is decreased and the ON-current is increased, and the operating speed is increased. That is to say, when the characteristic is plotted in the area C, the substrate bias control circuit 15 adjusts the substrate bias on the N-channel transistor side, and the substrate bias of the N-channel transistor becomes shallow. Namely, the characteristic of the element is adjusted in the direction of an arrow 67 shown in FIG. 8. Therefore, as shown in FIG. 8, the characteristic indicated by a point 661 is adjusted to the characteristic indicated by a point 662 when the ON-current Ionn is increased by an amount of current indicated by the arrow 67. This signifies that the substrate bias of the N-channel transistor becomes shallow and the operating speed is increased, thus it is adjusted to an appropriate ON-current Ionn.

In the area D, the signal UP stays active, and (EN1, EN2, EN3) become (L, L, L) or (L, H, L). Therefore, referring to FIG. 6, the control circuit 28 makes the signal NUP active which is outputted to the voltage producing portion 301. The U/D counter 311 counts up. Accordingly, the bias voltage producing circuit 321 decreases the substrate bias voltage VNW of the P-channel transistor. When the substrate bias of the P-channel transistor becomes shallow, the threshold voltage is decreased and the ON-current is increased, and the operating speed is increased. That is to say, when characteristic is plotted in the area D, the substrate bias control circuit 15 adjusts the substrate bias on the P-channel transistor side, and the substrate bias of the P-channel transistor becomes shallow. Namely, the characteristic of the element is adjusted in the direction of an arrow 69 shown in FIG. 8. Therefore, as shown in FIG. 8, the characteristic indicated by a point 681 is adjusted to the characteristic indicated by a point 682 when the ON-current Ionp is increased by an amount of current indicated by the arrow 69. This signifies that the substrate bias of the P-channel transistor becomes shallow and the operating speed is increased, thus it is adjusted to appropriate ON-current Ionp.

Like characteristic indicated by a point 711, adjustments may also be made as mentioned above in cases where the characteristic is close to that of the PN balance monitor target 3 and away from the delay monitor target 2. That is to say, in reference to the characteristic indicated by the point 711 in the area B, like the characteristic indicated by the point 631, the substrate bias of the N-channel transistor is adjusted first. The ON-current Ionn is decreased by an amount of electric current indicated by a point 721 and adjusted to characteristic indicated by a point 712 on the PN balance monitor target 3. On the PN balance monitor target 3, the signal EN1 becomes either "L" or "H", and the adjustment in either area A or B will be executed on the basis of the signal EN1. Namely, in the case that the element characteristic is plotted in the area B, when the adjustment continues, the characteristic will be plotted in the area A beyond the PN balance monitor target 3. In the case that the element characteristic is plotted in the area A, when the adjustment continues, the characteristic will be plotted in the area B beyond the PN balance monitor target 3. These adjustments are repeated before reaching characteristic indicated by a point 713.

In FIG. 8, each characteristic indicated by each of the points 612, 662, 682, 713 shows in the middle of the adjustment. The characteristic indicated by the point 632 is on the delay monitor target 2 and indicates that the adjustment is completed since both signals DOWN and UP outputted from the delay monitor portion 20 do not become active.

Figure 9:
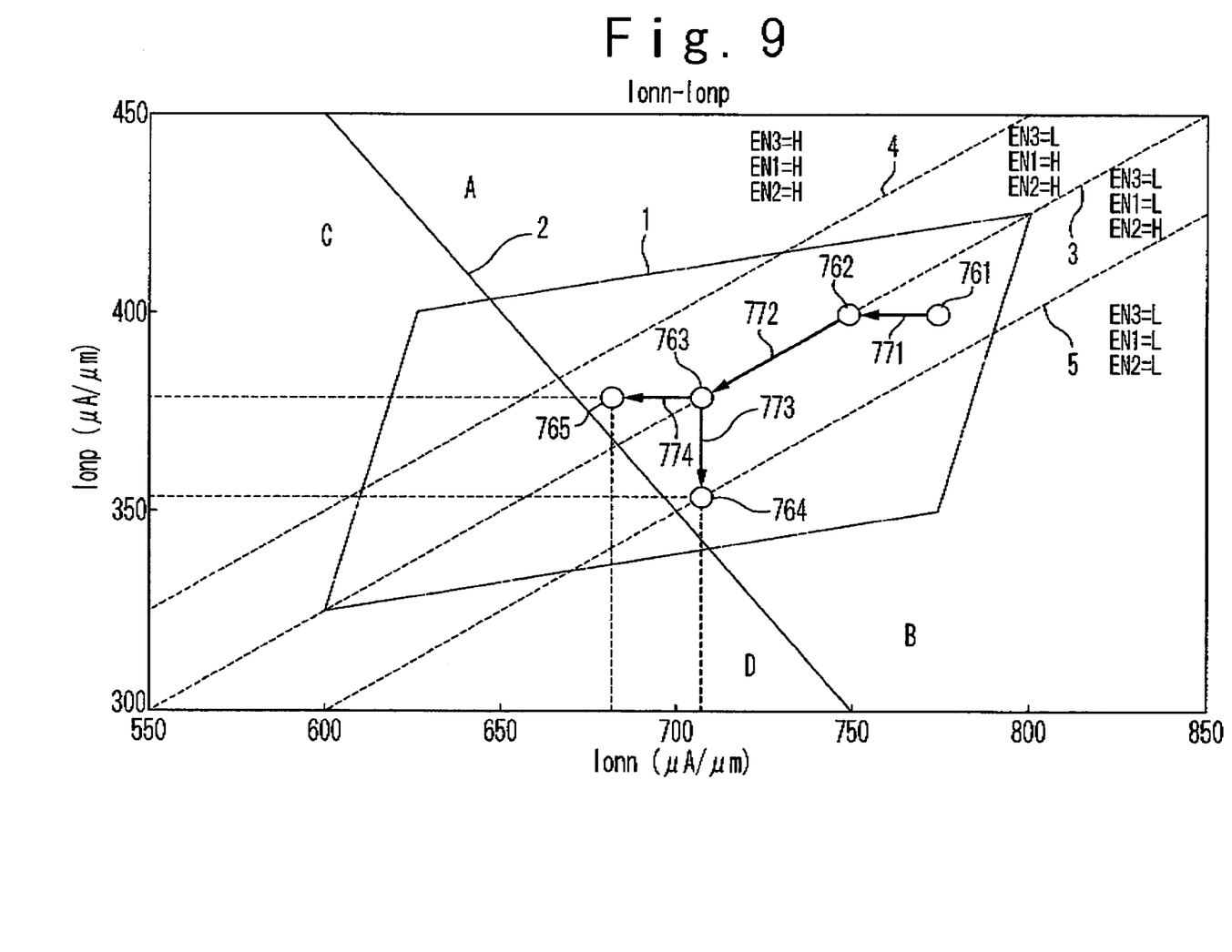
FIG. 9 is a graph for explaining the operation of the substrate bias control circuit of the embodiment according to present invention.

Next, the operation after reaching the PN balance monitor target 3 will be described below. FIG. 9 is a graph for explaining the operation of the substrate bias control circuit after reaching the PN balance monitor target 3. Referring to FIG. 9, a characteristic indicated by a point 761 is adjusted to characteristic indicated by a point 762 on the PN balance monitor target 3 according to the case where the element characteristic is plotted in the area B. After that, the characteristic indicated by the point 762 is adjusted to characteristic indicated by a point 763 according to the case where the element characteristic is plotted in the area A or B close to the PN balance monitor target 3 toward the delay monitor target 2. An amount of adjustment so far is shown by a sum of an arrow 771 and an arrow 772. A component of the ON-current Ionn corresponds to a count value of the U/D counter 312, and a component of the ON-current Ionp corresponds to a count value of the U/D counter 311.

Assuming that a count value of the U/D counter 312 reaches a limit value CPmn when reaching the point 763. The U/D counter 312 makes the signal CPmn active to inform the control circuit 28 that the count value reaches the limit value. On condition that the signal PDWN is made active, that is, when (EN1, EN2) become (L, H), the control circuit 28 makes the signal NDWN active instead of the signal PDWN as shown in FIG. 6. Therefore, when the characteristic is plotted within the allowable range between the PN balance monitor target 3 and the dashed line 5, the substrate bias of the P-channel transistor is adjusted differently from adjustment in normal area B, as indicated by an arrow 773. Since the signal EN2 becomes "L" when reaching a characteristic indicated by a point 764, the control circuit 28 does not make the signal NDWN active and then the adjustment is completed. Therefore, adjusted characteristics will not deviate from the allowable range of the PN balance monitor target 3. When comparing the points 763 and 764, it is found that the point 764 is away from the PN balance monitor target 3 to a certain degree but close to the delay monitor target 2 and that thereby the ON-current Ionp is decreased.

Assuming that a count value of the U/D counter 311 reaches a limit value CNmn when reaching the point 763. The U/D counter 311 makes the signal CNmn active to inform the control circuit 28 that the count value reaches the limit value. On condition that the signal NDWN is made active, that is, when (EN1, EN3) become (H, L), the control circuit 28 makes the signal PDWN active instead of the signal NDWN as shown in FIG. 6. Therefore, the U/D counter 312 is counted down. When the characteristic is plotted within the allowable range between the PN balance monitor target 3 and the dashed line 4, the substrate bias of the N-channel transistor is adjusted differently from adjustment in normal area A, as indicated by an arrow 774. When reaching characteristic indicated by a point 765, the U/D counter 312 indicates the limit value CPmn and then the adjustment is completed. When comparing the point 763 on the PN balance monitor target 3, it is found that, at the point 765 after adjustment, the ON-current Ionn is further decreased.

In the areas C, D, similar to the areas A, B, it is possible to control the substrate bias so as to be a little away from the PN balance monitor target 3 and close to the delay monitor target 2 as much as possible. In this manner, it is possible to make adjustments such that the ON-current is optimized within the allowable range of the PN balance monitor target.

Figure 10:
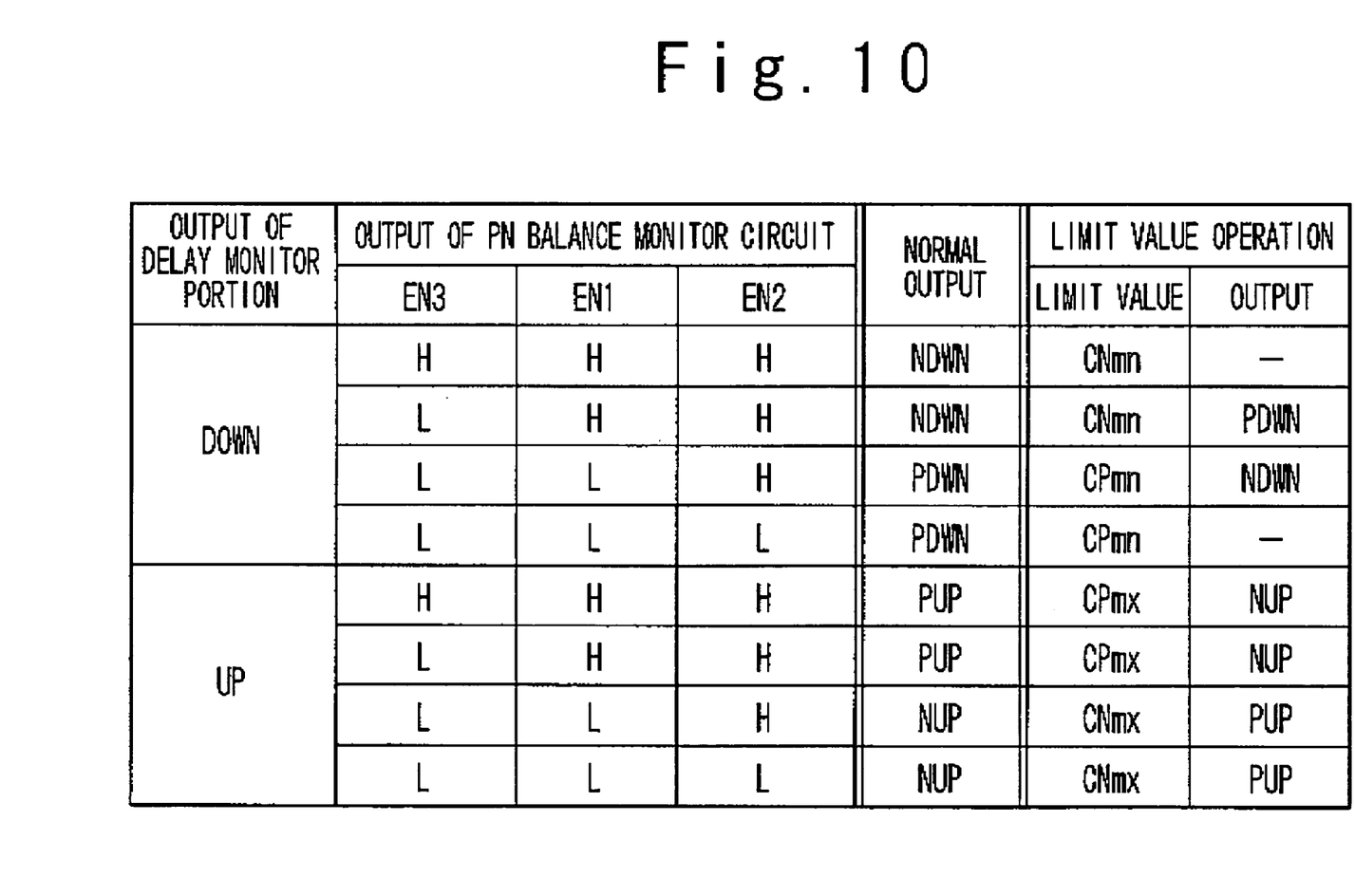
FIG. 10 is a truth table showing another example of the control logic of a control circuit of the embodiment according to the present invention.

FIG. 10 is a truth table showing another example of the control logic of a control circuit. As shown in FIG. 10, the control logic of the control circuit 28 may not be symmetric with respect to the output signals DOWN/UP of the delay monitor portion 20. In order to make the signal UP active, it is necessary that the operating speed of the P-channel transistor, N-channel transistor, or both should be below the design values. That is to say, this is in a situation that the operating speed is to be raised in order to secure the prescribed performance. Therefore, in order to obtain the characteristic close to the delay monitor target 2 as much as possible, the values are changed at two places in the truth table in FIG. 10 in comparison with the truth table as shown in FIG. 6. One of such change is that, when the signal UP is made active and (EN1, EN2, EN3) become (H, H, H) and the limit value CPmx, the output NUP is made active. The other is that, when the signal UP is made active and (EN1, EN2, EN3) become (L, L, L) and the limit value CNmx, the output PUP is made active.

Figure 11:
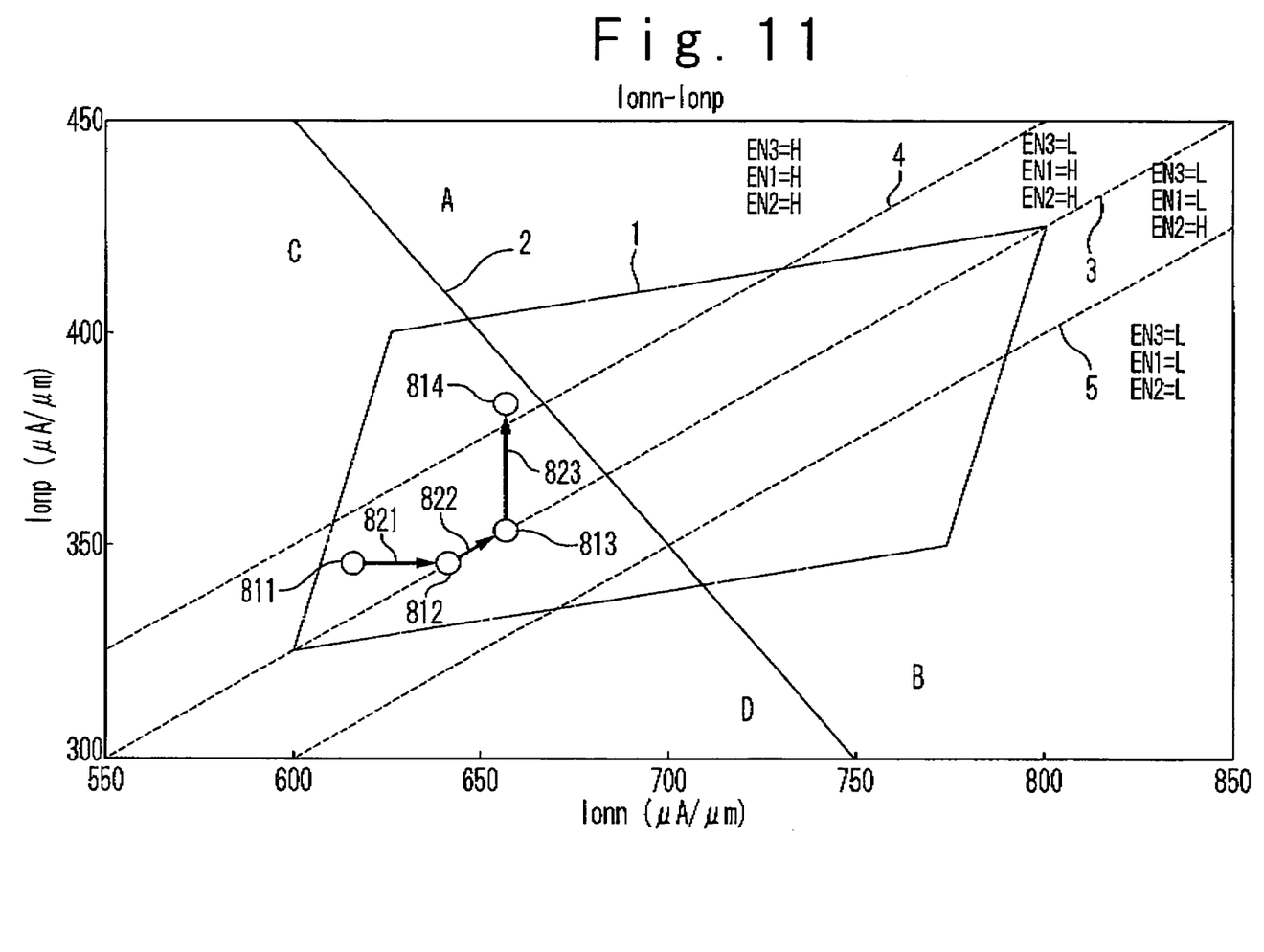
FIG. 11 is a graph for explaining the operation of the substrate bias control circuit of the embodiment according to present invention.

The operation of the substrate bias control circuit 15, which is operated according to the control logic indicated in FIG. 10, will be described below. FIG. 11 is a graph for explaining the operation of the substrate bias control circuit, Referring to FIG. 11, basic operation is the same as the operation previously described referring to FIG. 6. Therefore, characteristic indicated by a point 811 in the area C is first adjusted in the area C by an amount of adjustment indicated by an arrow 821 to turn out to be characteristic indicated by a point 812. After that, the characteristic indicated by the point 812 is adjusted in the area C or D by an amount of adjustment indicated by an arrow 822 to turn out to be characteristic indicated by a point 813 along the PN balance monitor target 3. When adjustments are made so far, the U/D counter 312 reaches limit value of a count up so as to make the signal CPmx active. Since adjustment of the substrate bias of the N-channel transistor comes to a stop, the substrate bias of the P-channel transistor that can be adjusted will be adjusted. Therefore, adjustments are made in the direction indicated by an arrow 823.

According to the control logic as shown in FIG. 6, when the characteristic moves to the dashed line 4 by means of adjustment, that is to say, when the signals (EN1, EN2, EN3) become (H, H, H), the output signals NUP, PUP do not become active and adjustment comes to a stop. According to the control logic as shown in FIG. 10, the output signal NUP is made active even when the signals (EN1, EN2, EN3) become (H, H, H), and the substrate bias of the P-channel transistor is further shallow-adjusted. Until the characteristic reaches the delay monitor target 2 or the U/D counter 311 for adjusting the substrate bias of the P-channel transistor reaches the limit value, the substrate bias of the P-channel transistor is adjusted. FIG. 11 shows a situation that the U/D counter 311 reaches the limit value. Therefore, although the PN balance is beyond the dashed line 4, it is found that the operating speed is closer to the design value because of closer to the delay monitor target 2.

As mentioned above, the substrate bias control circuit 15 is hard to deviate the performance management range of the transistor and it is possible to provide appropriate substrate bias. Besides, since the substrate bias control circuit 15 provides the main circuit 10 with appropriate substrate bias voltage, it is possible to curtail useless leakage current.

The present invention can provides the semiconductor integrated circuit device having the substrate bias voltage control circuit and the substrate bias voltage control method, in which the ON-current does not deviates from the transistor's performance management range and which can supply an appropriate substrate bias voltage. Furthermore, according to the present invention, since the appropriate substrate bias voltage is supplied to the semiconductor integrated circuit device, it is possible to reduce a useless leakage current. Moreover, according to the present invention, since the allowable range of the PN balance is set and the substrate bias voltage is controlled so that the leakage current is minimized within the allowable range of the PN balance, it is possible to further reduce the leakage current.

It is apparent that the present invention is not limited to the above embodiment that may be modified and changed without departing from the scope and spirit of the invention.

What is claimed is:

1. A semiconductor integrated circuit device comprising:
   a first bias generating circuit configured to generate a first substrate bias voltage of a P-channel transistor;
   a second bias generating circuit configured to generate a second substrate bias voltage of a N-channel transistor; and
   a control circuit configured to control said first bias generating circuit and said second bias generating circuit independently on the basis of operating states of circuits to which said first substrate bias voltage and said second substrate bias voltage are applied,
   wherein said control circuit operates in synchronization with a clock signal, and controls only one of said first substrate bias voltage and said second substrate bias voltage in one period of said clock signal.

2. A semiconductor integrated circuit device comprising:
   a first bias generating circuit configured to generate a first substrate bias voltage of a P-channel transistor;
   a second bias generating circuit configured to generate a second substrate bias voltage of a N-channel transistor;
   a control circuit configured to control said first bias generating circuit and said second bias generating circuit independently on the basis of operating states of circuits to which said first substrate bias voltage and said second substrate bias voltage are applied;
   a delay monitor portion configured to measure a delay time of a first circuit included in said circuits to which said first substrate bias voltage and said second substrate bias voltage are applied and output a comparison result between said delay time of the first circuit and a predetermined delay time; and
   a PN balance monitor portion configured to measure a balance between an on-current of said P-channel transistor and on-current of said N-channel transistor and output a PN balance signal,
   wherein said control circuit controls said first bias generating circuit and said second bias generating circuit independently on the basis of said comparison result and said PN balance signal.

3. The semiconductor integrated circuit device according to claim 2, wherein said PN balance monitor portion includes:
   a first delay circuit configured to generate a delay time which depends on a characteristic of said P-channel transistor,
   a second delay circuit configured to generate a delay time which depends on a characteristic of said N-channel transistor, and
   a first PN balance signal generating circuit configured to generate said PN balance signal on the basis of a difference between said delay time generated by said first delay circuit and said delay time generated by said second delay circuit.

4. The semiconductor integrated circuit device according to claim 3, wherein said PN balance monitor portion includes:
a second PN balance signal generating circuit configured to generate a second PN balance signal indicating whether or not said difference is in a predetermined range and output said second PN balance signal to said control circuit,
wherein said control circuit controls said first bias generating circuit and said second bias generating circuit independently such that a delay time is most close to said predetermined delay time in said predetermined range on the basis of said second PN balance signal.

5. The semiconductor integrated circuit device according to claim 3, wherein said first delay circuit includes:
a plurality of AND circuits configured to be cascade-connected to each other, and
wherein said second delay circuit includes:
a plurality of OR circuits configured to be cascade-connected to each other.

6. The semiconductor integrated circuit device according to claim 3, wherein said first delay circuit includes:
a plurality of NAND circuits configured to be cascade-connected to each other, and
wherein said second delay circuit includes:
a plurality of NOR circuits configured to be cascade-connected to each other.

7. The semiconductor integrated circuit device according to claim 2, wherein said delay monitor portion includes:
a clock delay circuit configured to output a first delay clock signal to which a clock signal is delayed by said first circuit,
a comparison portion configured to output a comparison result between said clock signal and said first delay clock signal,
wherein said PN balance monitor portion includes:
a first delay circuit configured to output a second delay clock signal to which said clock signal is delayed by said P-channel transistor,
a second delay circuit configured to output a third delay clock signal to which said clock signal is delayed by said N-channel transistor,
a PN balance signal generating circuit configured to output said PN balance signal on the basis of said second delay clock signal and said third delay clock signal.

8. The semiconductor integrated circuit device according to claim 7, wherein said first delay circuit outputs a fourth delay clock signal whose delay time is short by a time which corresponds to a predetermined number of said P-channel transistor,
said second delay circuit outputs a fifth delay clock signal whose delay time is short by a time which corresponds to a predetermined number of said N-channel transistor,
wherein said PN balance monitor portion further includes:
a second PN balance signal generating circuit configured to output a second PN balance signal indicating whether or not a delay difference between said fourth delay clock signal and said third delay clock signal is in a predetermined range, and
a third PN balance signal generating circuit configured to output a third PN balance signal indicating whether or not a delay difference between said fifth delay clock signal and said second delay clock signal is in a predetermined range,
wherein said control circuit controls said first bias generating circuit and said second bias generating circuit independently such that a delay time is most close to said predetermined delay time in said predetermined range on the basis of said second PN balance signal and said third PN balance signal.

9. The semiconductor integrated circuit device according to claim 8, wherein said first delay circuit includes:
a plurality of AND circuits configured to be cascade-connected to each other, and
wherein said second delay circuit includes:
a plurality of OR circuits configured to be cascade-connected to each other.

10. A substrate bias controlling method comprising:
(a) generating a first substrate bias voltage of a P-channel transistor;
(b) generating a second substrate bias voltage of a N-channel transistor; and
(c) controlling said first bias generating circuit and said second bias generating circuit independently on the basis of operating states of circuits to which said first substrate bias voltage and said second substrate bias voltage are applied,
wherein said step (c) includes:
(c1) controlling only one of said first substrate bias voltage and said second substrate bias voltage in one time.

11. A substrate bias controlling method comprising:
(a) generating a first substrate bias voltage of a P-channel transistor;
(b) generating a second substrate bias voltage of a N-channel transistor;
(c) controlling said first bias generating circuit and said second bias generating circuit independently on the basis of operating states of circuits to which said first substrate bias voltage and said second substrate bias voltage are applied;
(d) measuring a delay time of a first circuit included in said circuits to which said first substrate bias voltage and said second substrate bias voltage are applied and outputting a comparison result between said delay time of the first circuit and a predetermined delay time; and
(e) measuring a balance between an on-current of said P-channel transistor and on-current of said N-channel transistor and outputting a PN balance signal,
wherein said step (c) includes:
(c2) controlling said first bias generating circuit and said second bias generating circuit independently on the basis of said comparison result and said PN balance signal.

12. The substrate bias controlling method according to claim 11, wherein said step (e) includes:
(e1) generating said PN balance signal on the basis of a difference between a delay time depending on a characteristic of said P-channel transistor and a delay time depending on a characteristic of said N-channel transistor.

13. The substrate bias controlling method according to claim 12, wherein said step (e) includes:
(e2) generating a second PN balance signal indicating whether or not said difference is in a predetermined range and outputting said second PN balance signal to said control circuit,
wherein said step (c) includes:
(c3) controlling said first bias generating circuit and said second bias generating circuit independently such that a delay time is most close to said predetermined delay time in said predetermined range on the basis of said second PN balance signal.

* * * * *